(12) United States Patent
Lee (10) Patent No.: US 6,930,338 B2
(45) Date of Patent: Aug. 16, 2005

(54) UNIT PIXEL FOR USE IN CMOS IMAGE SENSOR

(75) Inventor: Won-Ho Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 25 days.

(21) Appl. No.: 10/748,405

(22) Filed: Dec. 29, 2003

(65) Prior Publication Data

US 2004/0217398 A1 Nov. 4, 2004

(30) Foreign Application Priority Data

Apr. 30, 2003 (KR) ................................. 10-2003-0027879

(51) Int. Cl.[7] ........................ H01L 27/108; H01L 27/00
(52) U.S. Cl. ...................... 257/292; 257/290; 257/291; 250/208.1; 250/214 R; 250/214.1; 348/296; 348/301; 348/308
(58) Field of Search ............................ 257/290–292, 257/443–444; 438/48, 57, 59, 60, 66, 75; 250/208.1, 214 R, 214.1; 348/296, 308, 300–301

(56) References Cited

U.S. PATENT DOCUMENTS 6,215,113 B1 * 4/2001 Chen et al. .............. 250/208.1
6,570,144 B1 * 5/2003 Lee et al. ................ 250/208.1
2004/0217262 A1 * 11/2004 Lee .......................... 250/208.1

* cited by examiner

Primary Examiner—Donghee Kang
(74) Attorney, Agent, or Firm—Blakely Sokoloff Taylor & Zafman (57) ABSTRACT

A unit pixel in a CMOS image sensor with a high sensitivity is employed by modifying a unit pixel circuit and a layout. The unit pixel in the CMOS image sensor includes: a photodiode; a transfer transistor disposed between the photodiode and a floating diffusion node, wherein a transfer control signal is applied to a gate; a reset transistor disposed between the photodiode and a VDD terminal, wherein a reset control signal is applied to a gate and a VDD is applied to a drain; a drive transistor of which a drain is connected to the VDD terminal and a gate is connected to the floating diffusion node; a selection transistor of which a drain is connected to a source of the drive transistor and a source is connected to an output terminal, wherein a selection control signal is applied to a gate; and a dummy transistor disposed between the drive transistor and the floating diffusion node, of which a gate is connected to the floating diffusion node.

23 Claims, 8 Drawing Sheets

UNIT PIXEL FOR USE IN CMOS IMAGE SENSOR

FIELD OF THE INVENTION

The present invention relates to a semiconductor device; and, more particularly, to a unit pixel in a complementary metal oxide semiconductor (CMOS) image sensor with a high sensitivity by modifying a unit pixel circuit and a layout.

DESCRIPTION OF THE PRIOR ART

A complementary metal oxide semiconductor (CMOS) image sensor is a device that converts an optical image to an electrical signal using a CMOS manufacturing technology, which employs a switching scheme of an MOS transistor for transporting photo-electric charges from a photodiode to an output node as well as detection of an output signal at the output node. In contrast with a charge coupled device (CCD) image sensor, the CMOS image sensor has following merits; its driving scheme is simplified and various scanning schemes may be implemented; it allows a signal processing circuit to be integrated on a single chip thereby minimize products; and it secures lower production costs and low power consumptions.

Figure 1:
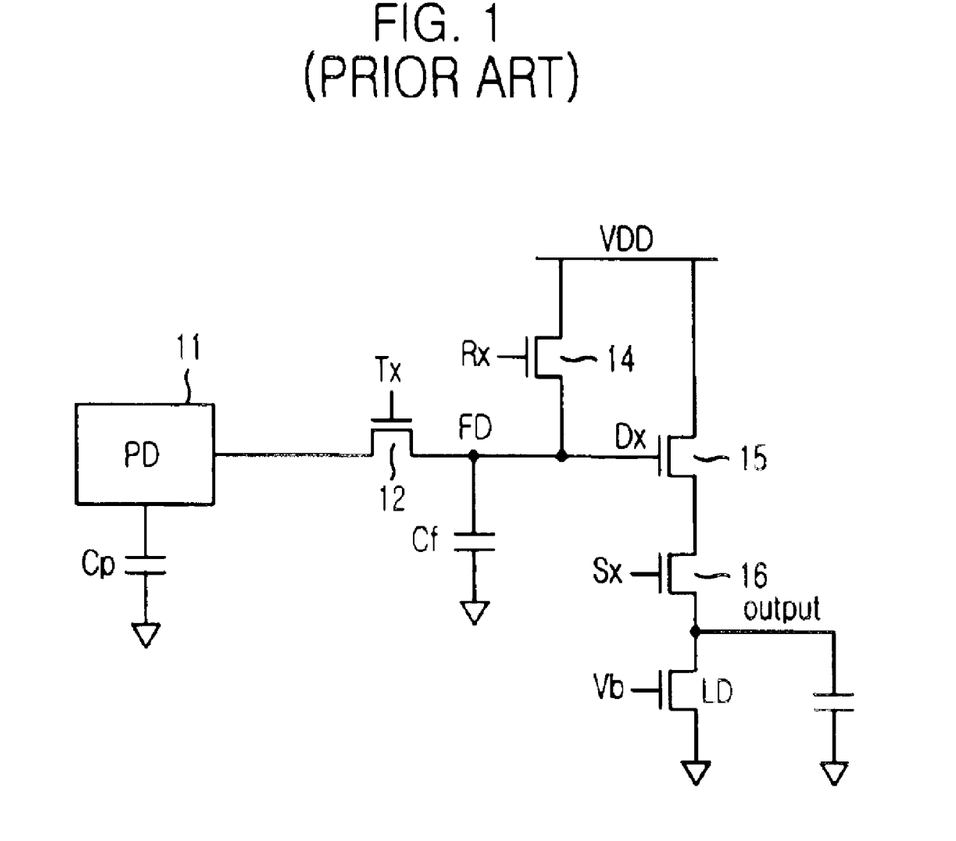
FIG. 1 is a circuit diagram setting forth a conventional unit pixel in a complementary metal oxide semiconductor (CMOS) image sensor.

Referring to FIG. 1, there is shown a circuit diagram of a conventional unit pixel in a CMOS image sensor. In FIG. 1, the conventional unit pixel in the CMOS image sensor includes one photodiode 11 and four NMOS transistors 12, 14, 15 and 16. The four transistors include a transfer transistor 12 for transferring the photo-electric charges generated from the photodiode 11 to a floating diffusion region 13, a reset transistor 14 for discharging the charges stored in the floating diffusion node 13 to detect subsequent signals, a drive transistor 15 acting as a source follower, and a selection transistor 16 for switching and addressing. In FIG. 1, a denotation of $C_F$, $C_P$, and LD represent a capacitance of the floating diffusion node 13, a capacitance of the photodiode 11 and a load transistor, respectively.

Figure 2A:
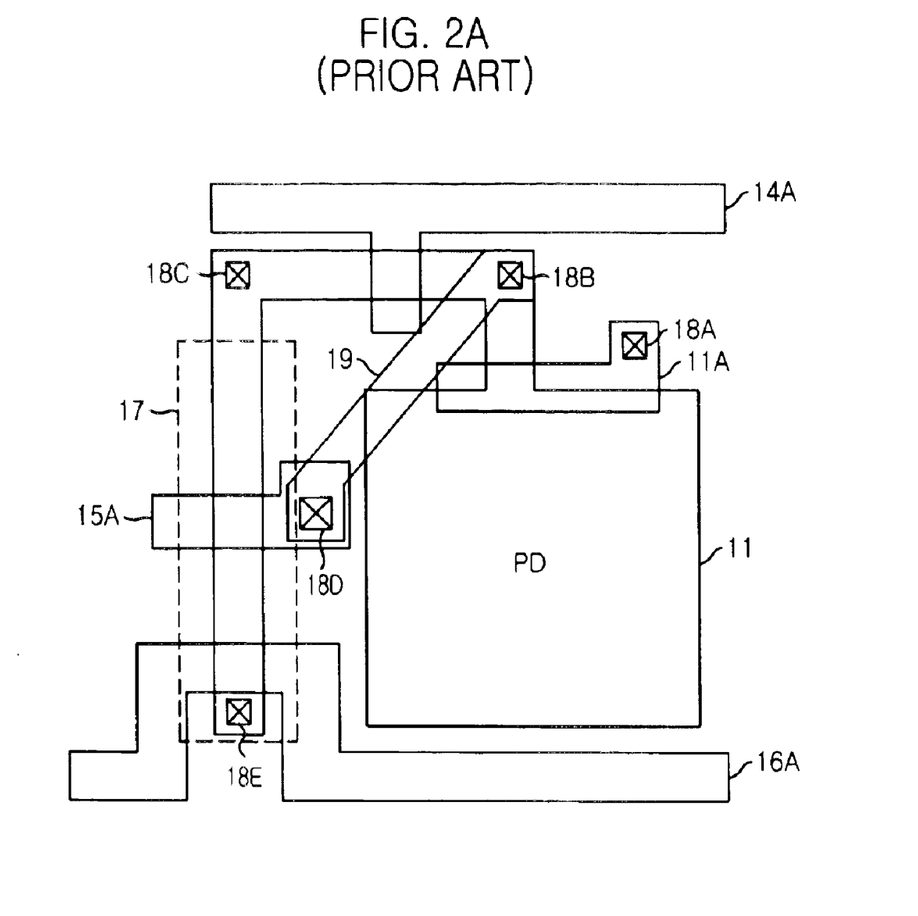
FIG. 2A is a plane view setting forth the conventional unit pixel in the CMOS image sensor.

Referring to FIG. 2A, there is shown a plane view setting forth the conventional unit pixel in the CMOS image sensor.

In FIG. 2A, a transfer gate 11A is overlapped a predetermined portion of an active area where the photodiode 11 will be formed. At the other side of the transfer gate 11A, there is formed the floating diffusion region. From the photodiode 11 to the floating diffusion region, a pathway area is reduced like a bottle neck, wherein the photodiode 11 has relatively a large area in comparison with the others. In a counter-clockwise direction from the photodiode 11, there are formed a reset gate 14A, a drive gate 15A and a selection gate 16A in series, wherein each gate is separated by each predetermined distance. Herein, the drive transistor 15 and the selection transistor 16 are formed in a p-well 17.

In addition, there are five contacts therein including a transfer contact 18A for applying the transfer control signal to the transfer gate 11A, a floating diffusion contact 18B and a drive contact 18D for connecting the floating diffusion node 13 to the drive gate 15A, the VDD contact 18C for applying a VDD thereto and an output contact 18E for outputting a predetermined signal.

Meanwhile, as a design rule is reduced nowadays, a linewidth of a desired pattern becomes also narrower and narrower because of a scale-down of the device. Therefore, the p-well 17 for the drive transistor 15 and the selection transistor 16 grows smaller too so that it is necessary to reduce a thickness of a photoresist mask for an ion-implantation process in order to secure a high resolution. On the contrary, in order to form a retrograde well in the CMOS image sensor, it is more preferable to form the photoresist mask thicker and thicker because a high ion-implantation energy is required for forming the retrograde well. Accordingly, in attempt to overcome the incompatible problem, there is employed an additional process for forming a mini p-well 17 for use in the drive transistor 15 and the selection transistor 16. That is, to begin with, the p-well is formed in a predetermined location of an epitaxial layer except the unit pixel area, e.g., a logic circuit area, through subsequent processes of a masking process, an ion-implantation process and a photostrip process. Afterward, the mini p-well 17 containing the drive transistor 15 and the selection transistor 16 is formed additionally in the unit pixel area through subsequent processes of another masking process, another ion-implantation process and another photostrip process. Thus, the process for manufacturing the CMOS image sensor is too complicated according to the conventional unit pixel layout.

Figure 2B:
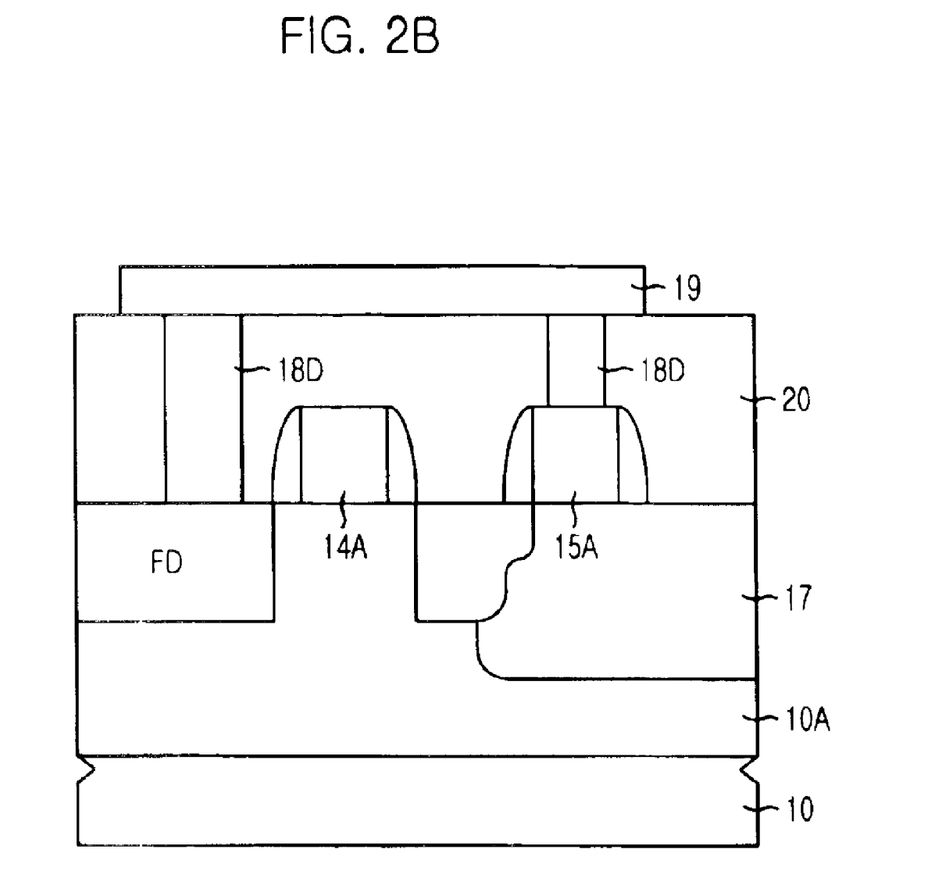
FIG. 2B is a cross sectional view setting forth an interconnection configuration between a gate of the reset transistor and a gate of the drive transistor.

Referring to FIG. 2B, there is shown a cross sectional view setting forth an interconnection configuration between the gate 14A of the reset transistor and the gate 15A of the drive transistor.

In FIG. 2B, the epitaxial layer 10A which is epitaxially grown up upon a semiconductor substrate 10 is prepared in which the mini p-well 17 is formed in predetermined locations thereof. Below one side of the reset gate 14A, the floating diffusion region is formed. In addition, source/drain regions is formed below the other side of the reset gate 14A. Furthermore, a floating diffusion contact 18B is embedded in an interlayer dielectric (ILD) 20 which is connected to the floating diffusion region. A drive contact 18B is also embedded in the ILD 20 and is connected to the gate 15A of the drive transistor. Herein, since the floating diffusion contact 18B is interconnected to the drive contact 18D through the metal interconnection 19, there is a shortcoming that a signal is transferred slowly. Moreover, the five contacts, i.e., three active contacts and two poly contacts, exist in the conventional unit pixel so that a bad pixel fail is likely to be happened such as a dark bad pixel, a white bad pixel or a saturation bad pixel, during a process for etching contacts with high aspect ratios and a gap-fill process.

SUMMARY OF THE INVENTION

It is, therefore, an object of the present invention to provide a unit pixel in a complementary metal oxide semiconductor (CMOS) image sensor with a high sensitivity by modifying a unit pixel circuit and a pixel layout.

In accordance with one aspect of the present invention, there is provided a unit pixel for use in a CMOS image sensor, including: a photodiode formed in a predetermined location of an active area; a transfer transistor disposed between the photodiode and a floating diffusion node, wherein a transfer control signal is applied to a gate; a reset transistor disposed between the photodiode and a power supply voltage (VDD) terminal, wherein a reset control signal is applied to a gate and a VDD is applied to a drain; a drive transistor of which a drain is connected to the VDD terminal and a gate is connected to the floating diffusion node; a selection transistor of which a drain is connected to a source of the drive transistor and a source is connected to an output terminal, wherein a selection control signal is applied to a gate; and a dummy transistor disposed between the drive transistor and the floating diffusion node, of which a gate is connected to the floating diffusion node.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 3A:
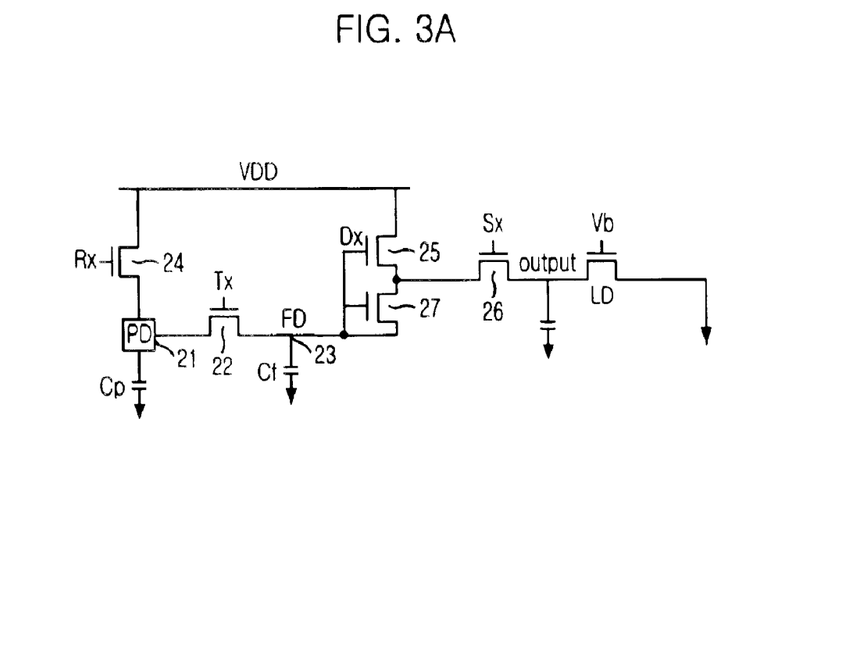
FIG. 3A is a circuit diagram setting forth a unit pixel in a CMOS image sensor in accordance with the present invention.

Referring to FIG. 3A, there is shown a circuit diagram setting forth a unit pixel for use in a CMOS image sensor in accordance with the present invention.

In FIG. 3A, the unit pixel includes a photodiode 21 and four NMOS transistors 22, 24, 25 and 26. The four transistors include a transfer transistor 22 for transferring photoelectric charges generated from the photodiode 21 to a floating diffusion node 23, a reset transistor 24 for discharging the charges stored in the floating diffusion node 23 to detect subsequent signals, a drive transistor 25 acting as a source follower, and a selection transistor 26 for switching and addressing. A VDD is applied to both a drain of the drive transistor 25 and a drain of the reset transistor 24. In addition, there is employed a dummy transistor 27 disposed between a source of the drive transistor 25 and the floating diffusion node 23, wherein the dummy transistor 27 has a threshold voltage higher than an operation voltage ($V_{OP}$) so that the dummy transistor 27 is always turned off.

Figure 3B:
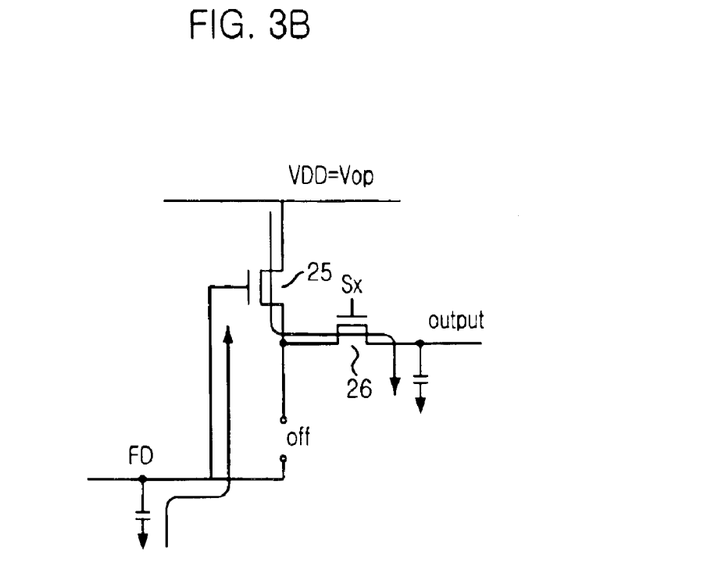
FIG. 3B is another circuit diagram setting forth a local current path around the dummy transistor in accordance with the present invention.

Referring to FIG. 3B, there is shown another circuit diagram setting forth a local current path around the dummy transistor 27.

In FIG. 3B, since the dummy transistor 27 with the high threshold voltage is disposed between the drive transistor 25 and the floating diffusion node 23, the current does not reversely flow into the floating diffusion node 23 although the drive transistor is turned on.

Figure 4:
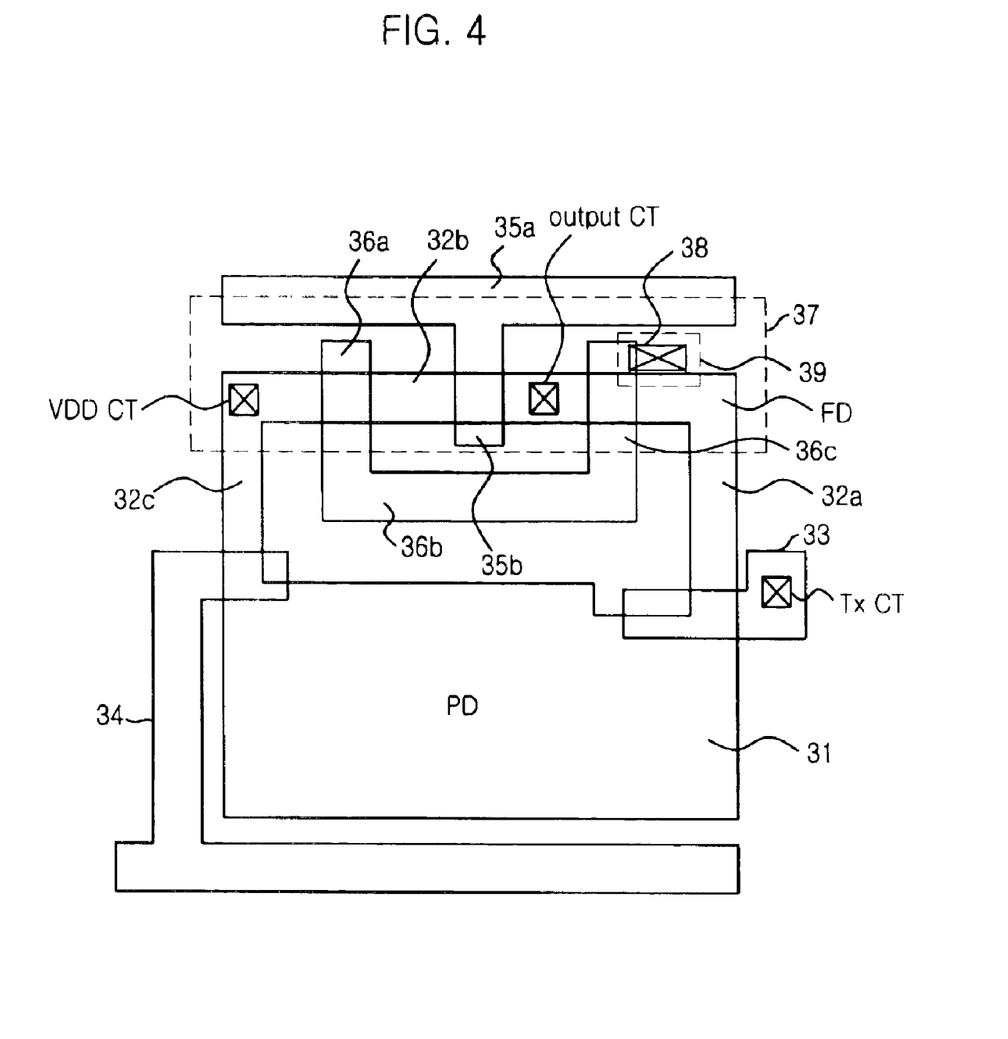
FIG. 4 is a plane view setting forth a unit pixel in a CMOS image sensor in accordance with a first preferred embodiment of the present invention.

Referring to FIG. 4, there is shown a plane view setting forth a unit pixel layout for use in a CMOS image sensor in accordance with a first preferred embodiment of the present invention.

In FIG. 4, an active area of the unit pixel includes a first active area 31 where the photodiode is formed and a second active area having a first region 32A where the transfer transistor and the floating diffusion node are formed, a second region 32B where the drive transistor and the selection transistor are formed and a third region 32C where the VDD contact and the reset transistor are formed. Herein, since the first active area 31 for the photodiode occupies a large area of the active area in the unit pixel, a fill-factor is increased in comparison with the conventional unit pixel. In the first embodiment, the second active area has a loop shape of which ends are connected to a side of the photodiode 31. In detail, the first region 32A is extended from one corner of the side of the first active area 31 to a predetermined length and the second region 32B is perpendicularly connected to the first region 32A. Furthermore, the third region 32C is perpendicularly connected to the second region 32B and is also connected to the other corner of the side of the first active area 31, to thereby form the second active area having the loop shape.

Here, the second region 32B of the second active area is sufficiently apart from the first active area 31 so that it is possible to form relatively a large p-well 37 in comparison with the conventional unit pixel. Herein, the p-well 37 contains the second region of the second active area completely. Accordingly, it is not required for carrying out an additional process for forming a mini p-well for the drive transistor and the selection transistor, which was required for manufacturing the conventional CMOS image sensor. To implement the above unit pixel layout is more illustrated in detail as followings.

Referring back to FIG. 4, a portion of the transfer gate 33 is overlapped an interface between the first active area 31 and the first region 32A of the second active area. In addition, a portion of the reset transistor is overlapped an interface between the first active area 31 and the third region 32C of the second active area. Furthermore, the selection gate is formed at upper portion of the unit pixel. That is, the selection gate includes a first selection gate region 35A and a second selection gate region 35B, wherein the first selection gate region 35A is formed parallel to the second region 32B of the second active area and a predetermined portion of the second selection gate region 35B is overlapped perpendicularly the second region. Herein, one end of the second selection gate region 35B is not overlapped the first active area 31.

Meanwhile, the gate of the drive transistor is formed between the selection gate and the first active area 31 in a shape that the drive gate seems to embrace the second selection gate region 35B. In detail, the drive gate has a first drive gate region 36A, a second drive gate region 36B and a third drive gate region 36C, wherein the second drive gate region 36B is formed parallel to the second region 35B of the second active area and is opposite to the first selection gate region 35A of the selection gate. Furthermore, the first drive gate region 35A and the third drive gate region 35C are connected to a side of the second drive gate region 35B, wherein the first drive gate region 35A is separated from the third drive gate region 35C by a predetermined distance. Herein, portions of the first drive gate region 35A and the third drive gate region 35C are overlapped a portion of the second region 32B of the second active area.

The third drive gate region 35C formed in the second region 35B of the second active area serves as a gate of the dummy transistor. The drive gate is connected to the floating diffusion node through a butting contact 38, to thereby reduce the number of the contact and improve a sensitivity of the CMOS image sensor. In detail, the number of contact is reduced from five contacts to four contacts, i.e., the VDD contact, the transfer contact, the output contact and the butting contact.

Meanwhile, there is formed a high threshold voltage region 39 around the butting contact 38 in order for a current not to reversely flow into the floating diffusion node, wherein the high threshold voltage region 39 is formed by means of a predetermined ion implantation process. Herein, the portions of the third drive gate region 36C and the floating diffusion node are partially overlapped the high threshold voltage region 39.

Figure 5:
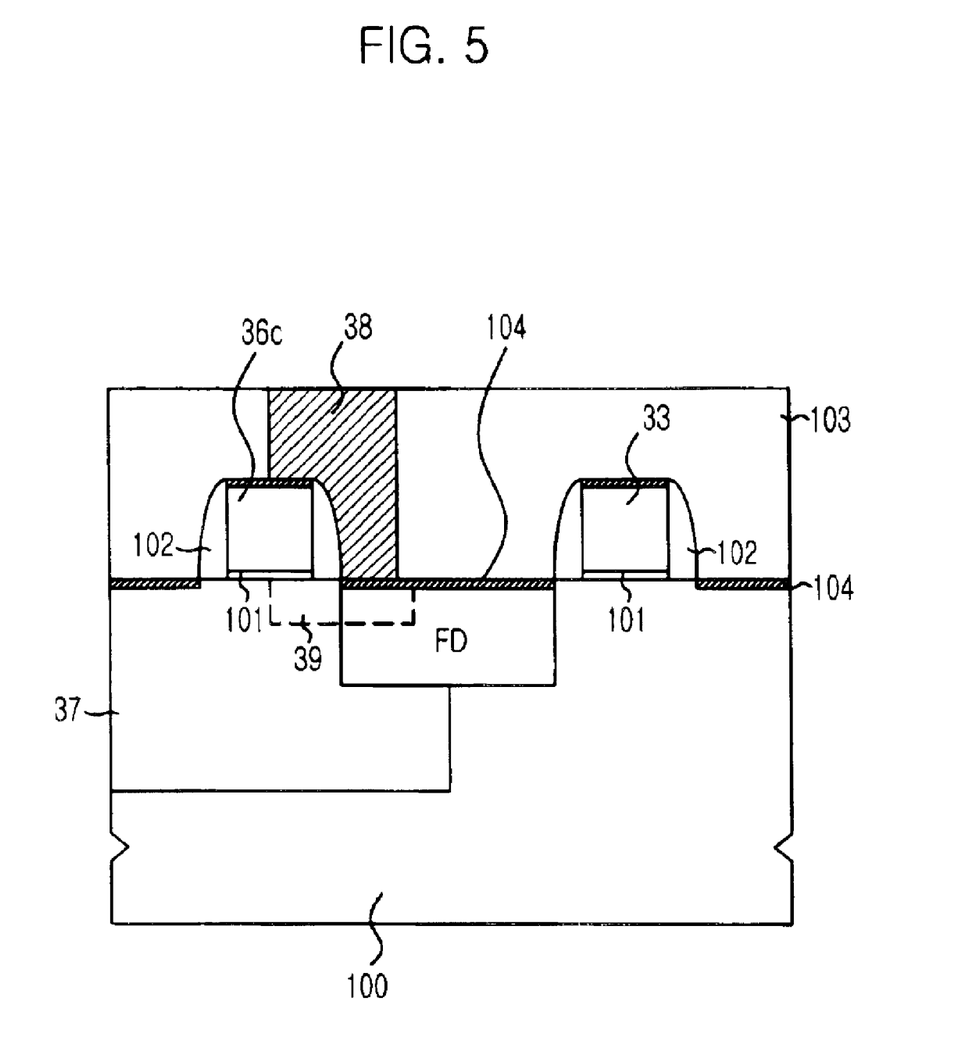
FIG. 5 is a cross sectional view setting forth interconnection configuration between the dummy transistor and the floating diffusion node in accordance with the first preferred embodiment of the present invention.

Referring to FIG. 5, there is shown a cross sectional view setting forth an interconnection configuration between the dummy transistor and the floating diffusion node in accordance with the first preferred embodiment of the present invention.

In FIG. 5, the p-well 37 is formed in a predetermined location of a p-type epitaxial layer 100. The third drive gate region 36C serving as the gate of the dummy transistor is formed over the p-well 37 and the gate of the transfer transistor is formed on the p-type epitaxial layer 100. Beneath the third gate drive region 36C and the gate 33 of the transfer transistor, a gate insulator 101 is formed. Furthermore, spacers 102 are formed on sidewalls of the third drive gate region 36A and the gate 33 of the transfer transistor. Between the third drive gate region 36C and the gate 33 of the transfer transistor, there is formed the floating diffusion node.

Additionally, the high threshold voltage region 39 is formed under a portion of the third drive gate region 36C and in a portion of the floating diffusion node. Here, the high threshold voltage region 39 is formed by implanting boron ($B^{11}$) into the p-type epitaxial layer 100 on condition that an ion implantation energy ranges from about 20 keV to about 40 keV and a dose amount ranges from about $1.0 \times 10^{12}$ atoms/cm$^2$ to about $9.0 \times 10^{13}$ atoms/cm$^2$. Alternatively, the high threshold voltage region 39 can be formed by means of $BF_2$ ions implantation into the p-type epitaxial layer 100 on condition that an ion implantation energy ranges from about 40 keV to about 60 keV and a dose amount ranges from about $1.0 \times 10^{12}$ atoms/cm$^2$ to about $9.0 \times 10^{13}$ atoms/cm$^2$. Therefore, the third drive gate region 36C has a higher threshold voltage than the operation voltage ($V_{OP}$), to thereby inhibit the current flowing reversely into the floating diffusion node.

In addition, a salicide 104 is formed on top surfaces of the third gate drive region 36C, the gate of the transfer transistor and predetermined portions of the p-type epitaxial layer 104. The butting contact 38 is embedded in an interlayer dielectric (ILD) 103 and is connected to both a portion of the third drive gate region 36C and a portion of the floating diffusion node. Herein, the butting contact employs tungsten.

Figure 6:
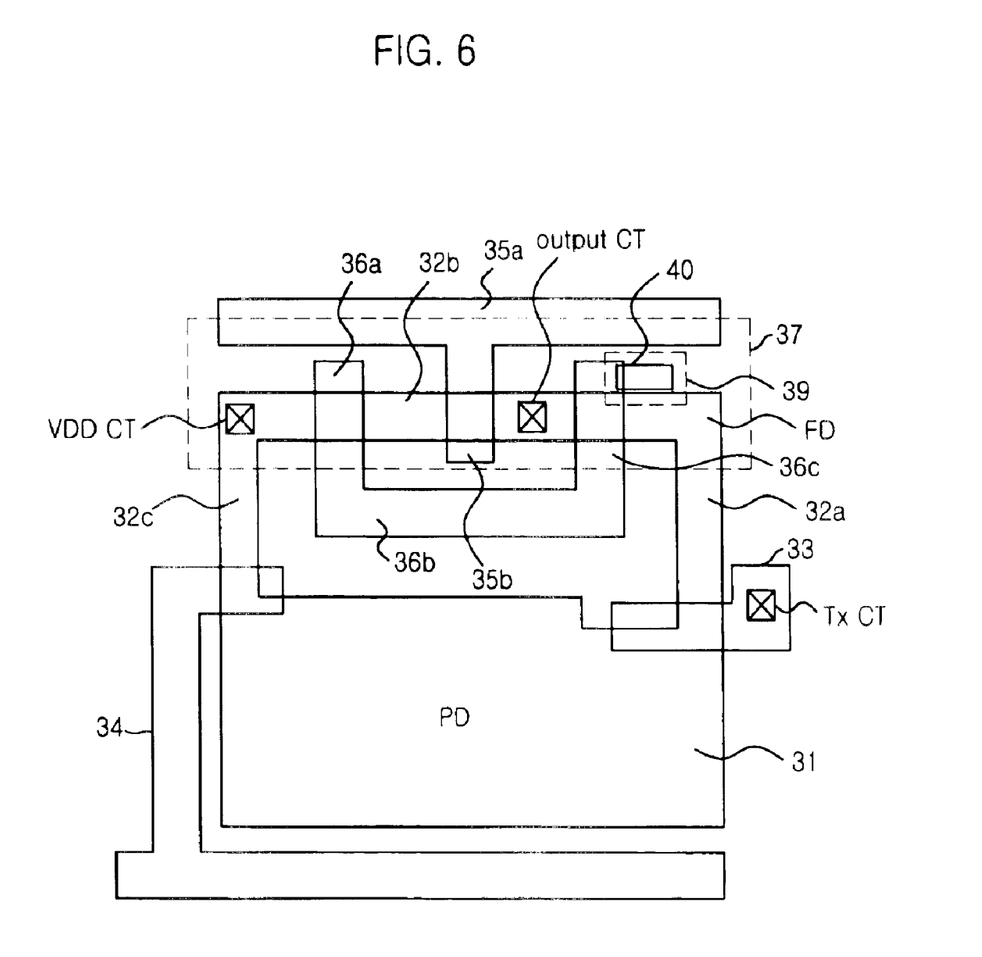
FIG. 6 is a plane view setting forth a unit pixel in a CMOS image sensor in accordance with a second preferred embodiment of the present invention.

Referring to FIG. 6, there is shown a plane view setting forth another unit pixel layout for use in a CMOS image sensor in accordance with a second preferred embodiment of the present invention.

In FIG. 6, the other element configuration is same to the first embodiment except a bridge connection 40. Therefore, further description for the other elements is abbreviated herein. In the second embodiment, a gate of the dummy transistor is connected to the floating diffusion node through the bridge interconnection 40 instead of the butting contact. Therefore, there are only three contacts, i.e., a transfer contact, a VDD contact and an output contact so that it is advantageous to reduce a bad pixel fail in comparison with the conventional unit pixel. Furthermore, since the gate of the drive transistor is connected to the floating diffusion node through the bridge connection 40, it is also advantageous to transfer a signal to adjacent transistor, thereby securing the CMOS image sensor with a high sensitivity.

Figure 7:
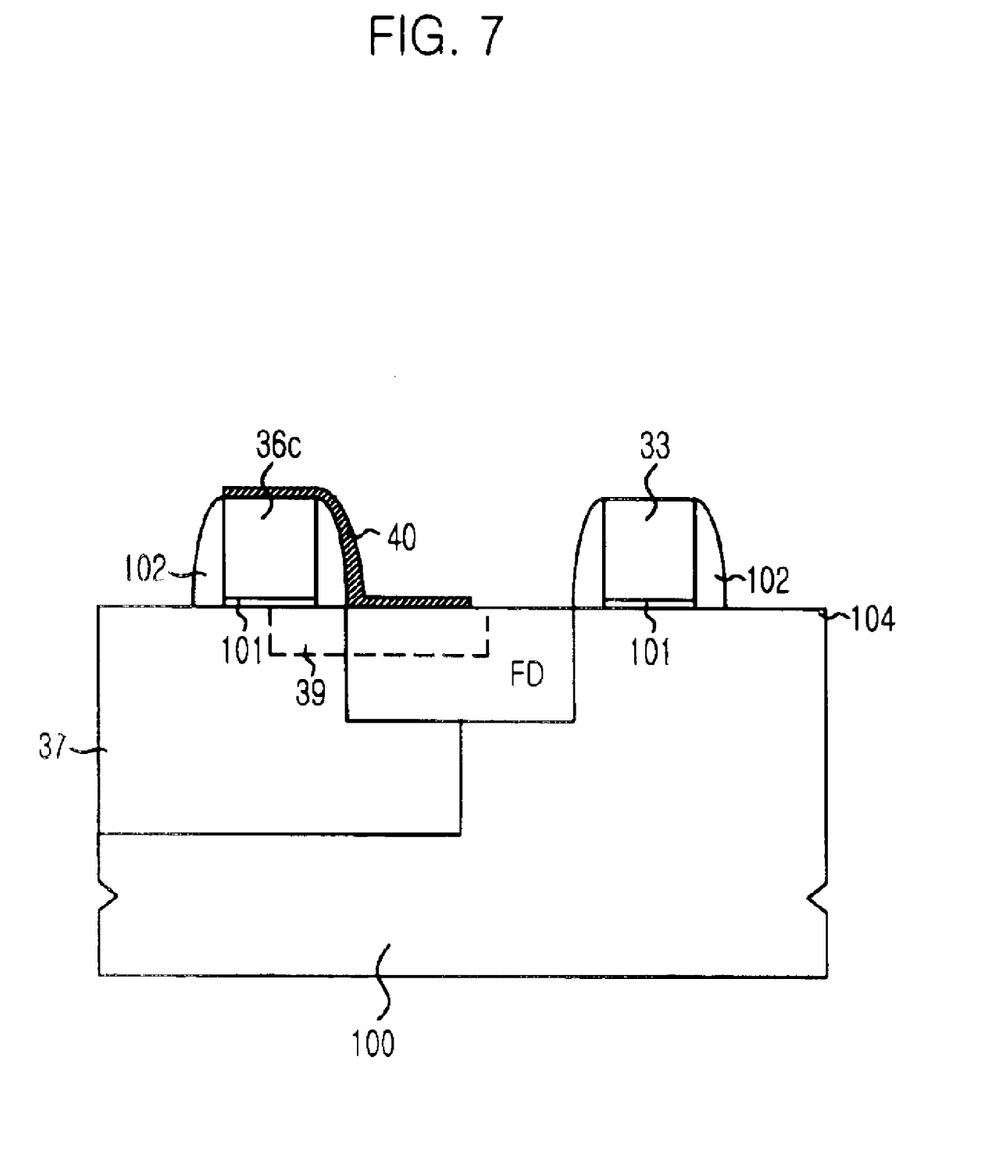
FIG. 7 is a cross sectional view setting forth interconnection configuration between the dummy transistor and the floating diffusion node in accordance with the second preferred embodiment of the present invention.

Referring to FIG. 7, there is shown a cross sectional view setting forth an interconnection configuration between the dummy transistor and the floating diffusion node in accordance with the second preferred embodiment of the present invention.

In FIG. 7, the p-well 37 is formed in a predetermined location of a p-type epitaxial layer 100. The third drive gate region 36C serving as the gate of the dummy transistor is formed over the p-well 37 and the gate of the transfer transistor is formed on the p-type epitaxial layer 100. Beneath the third gate drive region 36C and the gate 33 of the transfer transistor, a gate insulator 101 is formed. Furthermore, spacers 102 are formed on sidewalls of the third drive gate region 36A and the gate 33 of the transfer transistor. Between the third drive gate region 36C and the gate 33 of the transfer transistor, there is formed the floating diffusion node.

Additionally, the high threshold voltage region 39 is formed under a portion of the third drive gate region 36C and in a portion of the floating diffusion node. Here, the high threshold voltage region 39 is formed by implanting boron ($B^{11}$) into the p-type epitaxial layer 100 on condition that an ion implantation energy ranges from about 20 keV to about 40 keV and a dose amount ranges from about $1.0 \times 10^{12}$ atoms/cm$^2$ to about $9.0 \times 10^{13}$ atoms/cm$^2$. Alternatively, the high threshold voltage region 39 can be formed by means of $BF_2$ ions implantation into the p-type epitaxial layer 100 on condition that an ion implantation energy ranges from about 40 keV to about 60 keV and a dose amount ranges from about $1.0 \times 10^{12}$ atoms/cm$^2$ to about $9.0 \times 10^{13}$ atoms/cm$^2$. Therefore, the third drive gate region 36C has a higher threshold voltage than the operation voltage ($V_{OP}$), to thereby inhibit the current flowing reversely into the floating diffusion node.

Meanwhile, the bridge interconnection 40 is formed on the top surface and one of the spacers of the third drive gate region 36C and atop a portion of the floating diffusion node. Herein, the bridge interconnection 40 uses a salicide. Preferably, the bridge interconnection 40 of the salicide is formed through subsequent processes, i.e., a process for depositing tungsten, a process for a silicon (Si) ion implantation, an annealing process and an etching process. It is noted that the process for the Si ion implantation is employed in order to form the salicide on one of the spacer of the third drive gate region 36C. That is, in case of not employing the process for Si ion implantation, the bridge interconnection is not formed one of the spacer so that the gate of the dummy transistor is not connected to the floating diffusion node in the long run. Therefore, it is necessary to carry out the process for the Si ion implantation in the second embodiment.

As described above, the present invention provides an advantage that there are three or four contacts in the unit pixel in comparison with the connectional unit pixel having five contacts therein, to thereby reducing the bad pixel fail. In addition, since the drive transistor is connected to the floating diffusion node through the butting contact or the bridge interconnection, a signal transfer efficiency is also enhanced. Furthermore, in comparison with the conventional unit pixel, the p-well for the drive transistor and the selection transistor is enlarged by modifying the unit pixel layout so that it is possible to skip an additional process for forming the mini p-well for the drive and the selection transistors which is typically performed after a formation of the p-well in a logic circuit. Additionally, the dummy transistor of high threshold voltage is disposed between the drive transistor and the floating diffusion node, whereby the current does not flow reversely into the floating diffusion node.

While the present invention has been described with respect to the particular embodiments, it will be apparent to those skilled in the art that various changes and modifications may be made without departing from the scope of the invention as defined in the following claims.

What is claimed is:

1. A unit pixel for use in a complementary metal oxide semiconductor (CMOS) image sensor, comprising:
   a photodiode formed in a predetermined location of an active area;
   a transfer transistor disposed between the photodiode and a floating diffusion node, wherein a transfer control signal is applied to a gate;
   a reset transistor disposed between the photodiode and a power supply voltage (VDD) terminal, wherein a reset control signal is applied to a gate and a VDD is applied to a drain;
   a drive transistor of which a drain is connected to the VDD terminal and a gate is connected to the floating diffusion node;
   a selection transistor of which a drain is connected to a source of the drive transistor and a source is connected to an output terminal, wherein a selection control signal is applied to a gate; and
   a dummy transistor disposed between the drive transistor and the floating diffusion node, of which a gate is connected to the floating diffusion node.

2. The unit pixel as recited in claim 1, wherein the dummy transistor has a threshold voltage higher than an operation voltage so that the dummy transistor keeps to be turned off.

3. The unit pixel as recited in claim 2, wherein the dummy transistor has a high threshold voltage region which is overlapped portions of the floating diffusion node and the gate of the dummy transistor.

4. The unit pixel as recited in claim 3, wherein the high threshold voltage region is formed by means of boron ($B^{11}$) ions implantation on condition that an ion implantation energy ranges from about 20 keV to about 40 keV and a dose amount ranges from about $1.0 \times 10^{12}$ atoms/cm$^2$ to about $9.0 \times 10^{13}$ atoms/cm$^2$.

5. The unit pixel as recited in claim 3, wherein the high threshold voltage region is formed by means of $BF_2$ ions implantation on condition that an ion implantation energy ranges from about 40 keV to about 60 keV and a dose amount ranges from about $1.0 \times 10^{12}$ atoms/cm$^2$ to about $9.0 \times 10^{13}$ atoms/cm$^2$.

6. The unit pixel as recited in claim 1, wherein the gate of the drive transistor and the gate of the dummy transistor are formed as a single gate of a conductive material.

7. The unit pixel as recited in claim 1, wherein the gate of the drive transistor is electrically connected to the floating diffusion node through a butting contact.

8. The unit pixel as recited in claim 7, wherein the butting contact employs a tungsten.

9. The unit pixel as recited in claim 1, wherein the gate of the drive transistor is electrically connected to the floating diffusion node through a bridge interconnection.

10. The unit pixel as recited in claim 9, wherein the bridge connection uses a salicide.

11. The unit pixel as recited in claim 1, wherein the active area includes:
    a first active area where the photodiode is formed; and
    a second active area having a loop shape that each end is connected to a side of the first active area.

12. The unit pixel as recited in claim 11, wherein the second active area has:
    a first region extended from one corner of the side of the photodiode, where the transfer transistor and the floating diffusion node are formed;
    a second region formed perpendicular to the first region, where the drive transistor, the dummy transistor and the selection transistor are formed; and
    a third region formed perpendicular to the second region where the VDD terminal and the reset transistor are formed, wherein one end of the third region is connected to the other corner of the side of the photodiode.

13. The unit pixel as recited in claim 12, wherein the second region is contained a conductive well.

14. The unit pixel as recited in claim 12, wherein the gate of the drive transistor includes:
    a first drive gate region which is parallel with the second region separated by a predetermined distance;
    a second drive gate region formed perpendicular to the first drive gate region, wherein a portion of the second drive gate region is overlapped the second region; and
    a third drive gate region formed perpendicular to the first region separated from the second drive gate region by a predetermined distance, the third drive gate region serving as the gate of the dummy transistor.

15. A CMOS image sensor having a plurality of unit pixels, said each unit pixel comprising:
    a photodiode formed in a predetermined location of an active area;
    a transfer transistor disposed between the photodiode and a floating diffusion node, wherein a transfer control signal is applied to a gate;
    a reset transistor disposed between the photodiode and a power supply voltage (VDD) terminal, wherein a reset control signal is applied to a gate and a VDD is applied to a drain;
    a drive transistor of which a drain is connected to the VDD terminal and a gate is connected to the floating diffusion node;
    a selection transistor of which a drain is connected to a source of the drive transistor and a source is connected to an output terminal, wherein a selection control signal is applied to a gate; and
    a dummy transistor disposed between the drive transistor and the floating diffusion node, of which a gate is connected to the floating diffusion node.

16. The CMOS image sensor as recited in claim 15, wherein the dummy transistor has a threshold voltage higher than an operation voltage so that the dummy transistor keeps to be turned off.

17. The CMOS image sensor as recited in claim 16, wherein the dummy transistor has a threshold voltage region which is overlapped a portion of the floating diffusion node and the gate of the dummy transistor.

18. The unit pixel as recited in claim 17, wherein the high threshold voltage region is formed by means of boron ($B^{11}$) ions implantation on condition that an ion implantation energy ranges from about 20 keV to about 40 keV and a dose amount ranges from about $1.0 \times 10^{12}$ atoms/cm$^2$ to about $9.0 \times 10^{13}$ atoms/cm$^2$.

19. The unit pixel as recited in claim 17, wherein the high threshold voltage region is formed by means of $BF_2$ ions implantation on condition that an ion implantation energy ranges from about 40 keV to about 60 keV and a dose amount ranges from about $1.0 \times 10^{12}$ atoms/cm$^2$ to about $9.0 \times 10^{13}$ atoms/cm$^2$.

20. The CMOS image sensor as recited in claim 15, wherein the gate of the drive transistor and the gate of the dummy transistor are formed as a single gate of a conductive material.

21. The CMOS image sensor as recited in claim 15, wherein the gate of the drive transistor is electrically connected to the floating diffusion node through a butting contact.

22. The CMOS image sensor as recited in claim 15, wherein the gate of the drive transistor is electrically connected to the floating diffusion node through a bridge interconnection.

23. The CMOS image sensor as recited in claim 22, wherein the bridge connection uses a salicide.

* * * * *